(12) United States Patent
Iketa et al.

(10) Patent No.: US 7,604,928 B2
(45) Date of Patent: Oct. 20, 2009

(54) PATTERNING METHOD AND METHODS FOR PRODUCING ELECTRO-OPTIC DEVICE, COLOR FILTER, ILLUMINANT, AND THIN-FILM TRANSISTOR

(75) Inventors: Osamu Iketa, Yokohama (JP); Nobuo Kawase, Yokohama (JP); Keishi Saito, Tokyo (JP); Takeo Ono, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 409 days.

(21) Appl. No.: 11/566,488

(22) Filed: Dec. 4, 2006

(65) Prior Publication Data

US 2007/0148564 A1    Jun. 28, 2007

(30) Foreign Application Priority Data

Dec. 22, 2005    (JP)    ............................. 2005-370096

(51) Int. Cl.
*G03F 7/26*    (2006.01)
(52) U.S. Cl. .................. 430/327; 430/311; 430/320; 430/322
(58) Field of Classification Search ................ 430/311, 430/320, 322, 327
See application file for complete search history.

(56) References Cited

U.S. PATENT DOCUMENTS

| 6,113,448 | A | 9/2000 | Kobayashi et al. | ............ 445/24 |
| 6,309,782 | B1 * | 10/2001 | Ohtsu et al. | .................... 430/7 |
| 7,141,756 | B2 | 11/2006 | Ohmi et al. | ............ 219/121.42 |
| 2005/0170543 | A1 | 8/2005 | Sugawara et al. | ............. 438/38 |

FOREIGN PATENT DOCUMENTS

| JP | 09-106755 | 4/1997 |
| JP | 10-064415 | 3/1998 |
| JP | 11-040397 | 2/1999 |
| JP | 2000-223270 | 8/2000 |
| JP | 2002-299241 | 10/2002 |
| JP | 2002-372921 | 12/2002 |
| WO | WO 03/056622 | 7/2003 |

* cited by examiner

*Primary Examiner*—Kathleen Duda
(74) *Attorney, Agent, or Firm*—Fitzpatrick, Cella, Harper & Scinto

(57) ABSTRACT

A patterning method forms a pattern including a lyophilic region and a lyophobic region. The method includes treating the surface of an object by exposing an atmosphere containing at least one gas selected from the group consisting of hydrogen, deuterium, deuterated hydrogen, and tritium; partially exposing the treated surface to light to form an exposed region and an unexposed region; and applying a liquid onto one of the exposed region and the unexposed region.

11 Claims, 8 Drawing Sheets

PATTERNING METHOD AND METHODS FOR PRODUCING ELECTRO-OPTIC DEVICE, COLOR FILTER, ILLUMINANT, AND THIN-FILM TRANSISTOR

BACKGROUND OF THE INVENTION

1. Field of the Invention

The present invention relates to methods for producing electro-optic devices such as organic electroluminescence display devices and surface-conduction electron-emitting display devices, illuminants such as fluorescent phosphors, color filters, and thin film transistors, and a patterning method used in these methods.

2. Description of the Related Art

Electro-optic devices include liquid crystal display devices, electroluminescent display devices, and field emission display devices (FEDs). These devices may optionally use color filters or color illuminants to form color images.

An organic electroluminescent display device includes light-emitting elements for producing red (R), green (G), and blue (B) emissions. These light-emitting elements are conventionally prepared by a liquid jet method, such as an on-demand ink jet method. Specifically, an organic material is jetted onto predetermined regions intended for pixels on a substrate to form organic material layers intended for the active layers (luminescent layer, charge injection layer, charge transport layer, etc.) of the light-emitting elements, and the organic material layers are dried.

For a surface-conduction electron-emitting display device (SED), films of surface-conduction electron-emitting elements can be formed by a liquid jet method. For example, Japanese Patent Laid-Open No. 09-106755 discloses a method in which a metal complex solution for the element films is jetted between each pair of electrodes and dried and then a current is passed through each element film to form a gap in the film.

For the organic electroluminescent display device, a liquid organic EL (electroluminescent) material can be jetted onto pixel regions to form films.

For example, Japanese Patent Laid-Open No. 2002-372921 discloses a method in which banks separating pixel regions are formed in a multilayer structure including an inorganic layer and an organic layer. The banks are then continuously subjected to oxygen plasma treatment and fluorine plasma treatment to modify their surface. Thus, the surface of the lower layer of the bank is turned lyophilic, and the surface of the upper layer is turned liquid-repellent. An organic EL material is jetted onto the surface of the surface-modified substrate. The organic EL material that deposits on the liquid-repellent surface of the upper layer of the bank does not wet the adjacent pixels or spread. On the other hand, the organic EL material that has been applied onto the lyophilic surface of the lower layer of the bank is drawn into the pixels and fixed. Thus, the organic material can be precisely fixed in predetermined pixel regions.

Japanese Patent Laid-Open No. 2000-223270 discloses another method in which a photocatalyst layer is formed on an electrode pattern. The photocatalyst layer is exposed to light with a predetermined pattern to increase the wettability of the photocatalyst layer overlying the electrode. A luminescent layer is then selectively formed on the exposed pixel regions by ink jetting.

However, the method disclosed in Japanese Patent Laid-Open No. 2002-372921 may not form a desired lyophilic pattern and lyophobic pattern unless proper conditions are set for generating plasma.

The methods disclosed in Japanese Patent Laid-Open Nos. 2002-372921 and 2000-223270 require forming a multilayer structure including an inorganic layer and an organic layer, or forming a photocatalyst. This reduces the range of choices in designing the manufacturing process.

In order to apply a functional material to desired regions precisely, or in order to form a precise pattern, all techniques require a surface treatment to provide that regions where liquid is applied have different wettability from the other regions. It is desired that any such surface treatment be simple while not reducing the range of choices in designing the manufacturing process.

SUMMARY OF THE INVENTION

The present invention provides a method for simply forming a pattern including a lyophilic region and a lyophobic region.

The present invention also provides methods for producing an electro-optic device, a color filter, an illuminant, and a thin film transistor, including a patterning method.

The patterning method includes: (a) treating the surface of an object by exposing the surface to an atmosphere containing at least one gas selected from the group consisting of hydrogen, deuterium, deuterated hydrogen, and tritium; (b) partially exposing the treated surface to light to form an exposed region and an unexposed region; and (c) applying a liquid onto one of the exposed region and the unexposed region.

In another embodiment, an electro-optic device is produced having a plurality of elements on a substrate, each said element emitting light or electrons according to electrical energy supplied. The method includes (a) treating the surface of the substrate by exposing the surface to an atmosphere containing at least one gas selected from the group consisting of hydrogen, deuterium, deuterated hydrogen, and tritium; (b) partially exposing the treated surface to light to form exposed regions and unexposed regions; (c) applying a liquid onto the exposed regions or the unexposed regions; and (d) forming the elements using the liquid.

In yet another embodiment, a color filter is produced by (a) treating the surface of a substrate by exposing the surface to an atmosphere containing at least one gas selected from the group consisting of hydrogen, deuterium, deuterated hydrogen, and tritium; (b) partially exposing the treated surface to light to form an exposed region and an unexposed region; and (c) applying a liquid onto one of the exposed region and the unexposed region to form a color layer.

In yet another feature, an illuminant is formed by (a) treating the surface of a substrate by exposing an atmosphere containing at least one gas selected from the group consisting of hydrogen, deuterium, deuterated hydrogen, and tritium; (b) partially exposing the treated surface to light to form an exposed region and an unexposed region; and (c) applying a liquid onto one of the exposed region and the unexposed region to form an illuminant material layer.

In addition a method for producing a thin film transistor includes (a) treating the surface of a substrate by exposing the surface to an atmosphere containing at least one gas selected from the group consisting of hydrogen, deuterium, deuterated hydrogen, and tritium; (b) partially exposing the treated surface to light to form an exposed region and an unexposed region; and (c) applying a liquid onto one of the exposed region and the unexposed region to form an active layer.

An embodiment of the invention can form a pattern including a lyophilic region and a lyophobic region using a simpler method than used heretofore, wherein the method can selectively apply a liquid onto desired regions.

Thus, a highly precise pattern can be formed.

Further features of the present invention will become apparent from the following description of exemplary embodiments with reference to the attached drawings.

DESCRIPTION OF THE EMBODIMENTS

A patterning method according to an embodiment of the present invention will now be described with reference to FIG. 1.

A substrate 20 made of, for example, silicon or silicon oxide is prepared as an object to be treated.

Figure 1A:
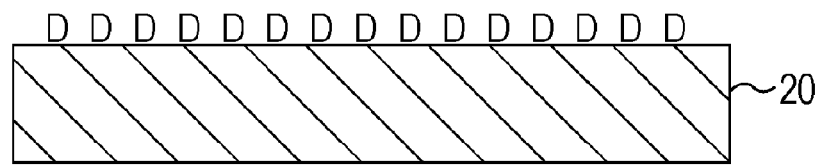
FIGS. 1A to 1D are schematic sectional views illustrating a patterning method according to an embodiment of the present invention.

As shown in FIG. 1A, the surface of the substrate 20 is treated by exposing the surface to an atmosphere containing at least one gas selected from the group consisting of hydrogen, deuterium, deuterated hydrogen, and tritium. Thus, the surface of the substrate is terminated with broadly defined hydrogen (D) by the surface treatment.

Figure 1B:
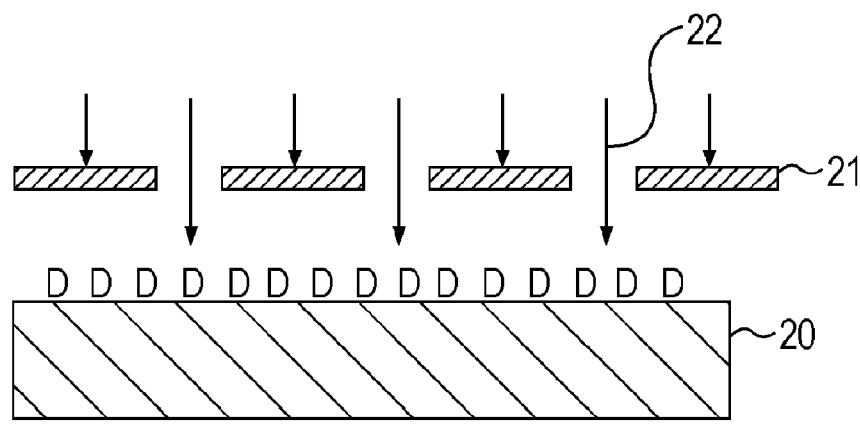

Turning now to FIG. 1B, after the surface treatment, the surface of the substrate is partially exposed to light. In this exposure step, the surface of the substrate may be selectively exposed to light by vector scan or raster scan to define exposed regions. Alternatively, the surface of the substrate may be entirely exposed to light at one time through an optical mask 21 to define exposed regions corresponding to the pattern of the optical mask 21, as shown in FIG. 1B. The hydrogen terminating the surface is desorbed by the exposure step.

The light 22 used for the exposure may be ultraviolet (UV) light, noncoherent light generated from a mercury lamp, or coherent light such as laser light.

Figure 1C:
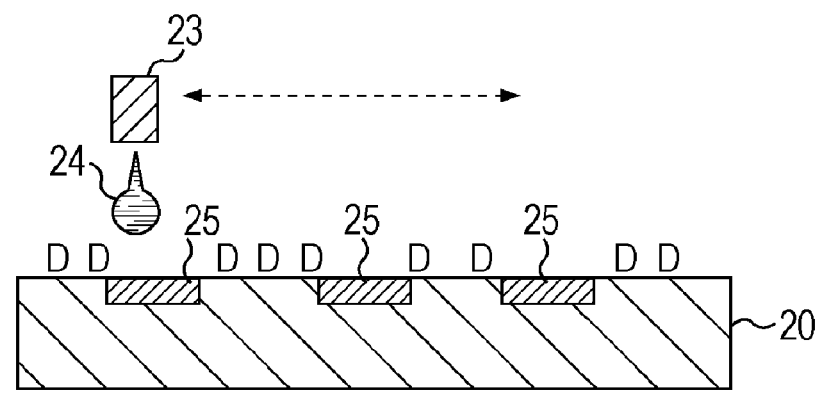

After optionally exposing the surface of the substrate to atmospheric air or an atmosphere containing water, a liquid 24 is applied onto the exposed regions 25 of the substrate 20, as shown in FIG. 1C. In this liquid application step, the liquid 24 can be selectively applied to the exposed regions 25 by a liquid jet method, such as an on-demand ink jet method using an ink jet head 23.

In the ink jet method, the liquid is jetted as flying droplets from the ink jet head 23 scanning in the direction indicated by the double-headed arrow, and is thus applied to predetermined regions. In the embodiment of the present invention, the exposed regions and the unexposed regions have different wettability to the liquid. Accordingly, the liquid can be confined in desired regions even if it slightly diverges from targeted positions.

The liquid may be a solution containing a functional material, or a suspension in which a functional material is dispersed. The functional material can be appropriately selected according to the pattern to be formed. Hence, the liquid itself may form the pattern, or may be a precursor of the material forming the pattern. The solvent or disperse medium of the liquid can be water if the liquid is applied to hydrophilic regions (for example, exposed regions) to form a liquid pattern. If the liquid is applied to hydrophobic regions (for example, unexposed regions) to form a liquid pattern, an organic solvent, such as oil, can be used.

Figure 1D:
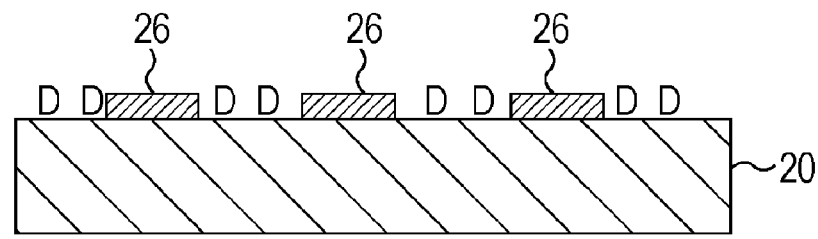

Turning now to FIG. 1D, the liquid applied to the exposed regions 25 of the substrate is dried.

Thus, a pattern 26 is formed which is made of the dried liquid, that is, made of the functional material or a derivative from the functional material.

Before or after the formation of the pattern 26, other functional layers may be formed, including an electrode or a liquid receiving layer. Thus, a variety of elements or devices as mentioned above can be produced.

An embodiment of the surface treatment step will now be described.

Figure 2:
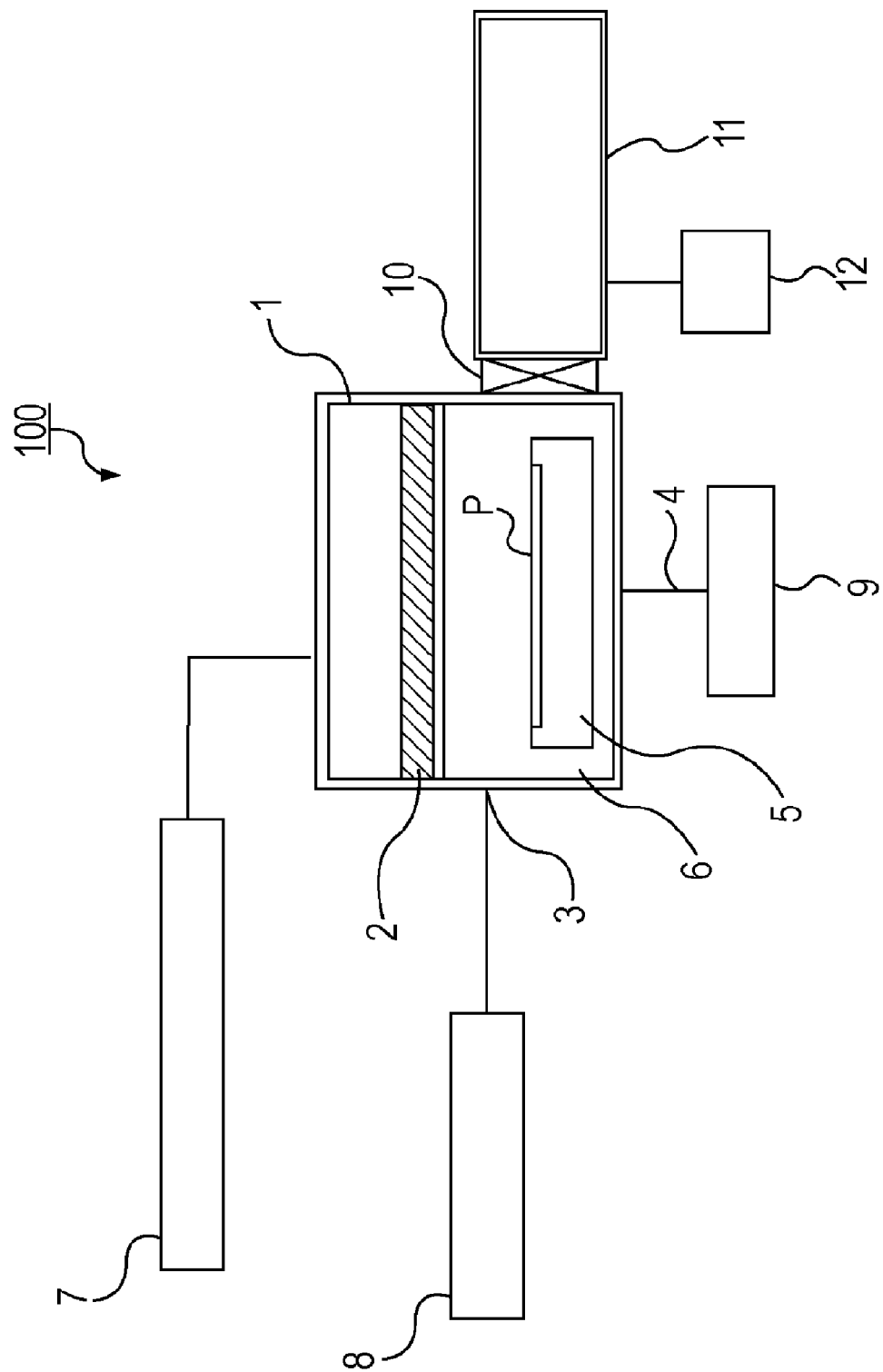
FIG. 2 is a schematic sectional view of an apparatus for performing surface treatment according to an embodiment of the present invention.

FIG. 2 is a schematic sectional view of an apparatus 100 for performing the surface treatment step in the embodiment.

The apparatus 100 includes two air-tight chambers: one is a treatment chamber 6 in which a substrate P is placed and whose internal pressure can be reduced; and the other is a load lock chamber 11 disposed immediately anterior to the treatment chamber 6 and whose internal pressure can be reduced.

A gate valve 10 is provided between the treatment chamber 6 and the load lock chamber 11 to separate their internal atmospheres from each other.

The substrate P, which is the object to be treated, is transferred into the load lock chamber 11 under atmospheric pressure by a conventional transfer system (not shown). In this instance, the substrate P is housed in, for example, a carrier cassette and transferred into the load lock chamber 11 from the cassette through access means disposed at the atmosphere side, such as a gate valve 10. The gate valve 10 between the treatment chamber 6 and the load lock chamber 11 is closed during transfer, and the treatment chamber 6 is evacuated to substantial vacuum.

Then, the load lock chamber 11 containing the substrate P is sealed and the pressure of the lock chamber 11 is reduced to a predetermined pressure with a pressure reducing device, such as a vacuum pump 12. Subsequently, the substrate P is transferred into the treatment chamber 6 through the open gate valve 10 with a conventional vacuum transfer system (not shown).

The treatment chamber 6 includes a gas-delivering device 8, a gas inlet 3, an exhaust pipe 4, an exhaust system 9, a heater stage 5 capable of heating the substrate P, a microwave generator 7, a microwave applicator 1, and a microwave transmitting window 2.

The gas-delivering device 8 supplies a gas containing deuterium (D) acting as a treatment gas into the treatment chamber 6 through the gas inlet 3 while the flow rate of the gas is controlled. The treatment gas, however, is not limited to deuterium, but may be any other hydrogen-based gas, such as hydrogen (H), deuterated hydrogen (HD), tritium (T), or a mixture containing at least two gases selected from the above-noted hydrogen-based gases. The gas selected from the hydrogen-based gases may be mixed with an inert gas, such as helium, neon, argon, xenon, or krypton.

The exhaust pipe 4 discharges the treatment gas introduced to the treatment chamber 6 and reaction products of the surface treatment to the outside of the treatment chamber 6.

The exhaust system 9 controls the pressure in the treatment chamber 6 to a predetermined value according to the reading of a pressure sensor (not shown). The exhaust system 9 includes a conductance valve, a vacuum pump, a shut valve, and others.

The heater of the heater stage 5 is optional. The heater may heat the substrate P and control its temperature to a desired temperature during the treatment. In the present embodiment, the heater stage 5 controls the temperature of the substrate P in the range of 180 to 400° C., and preferably in the range of 250 to 400° C. The temperature of the substrate can be measured with a thermocouple provided to the stage or a noncontact thermometer, such as a radiation thermometer.

The microwave generator 7 excites the treatment gas by generating microwaves to turn the gas into a plasma. In the present embodiment, the treatment gas is turned into plasma inside the treatment chamber 6, in which the substrate P is placed, and the surface of the substrate P is exposed to the products of the plasma treatment, including excited hydrogen, excited deuterium, excited deuterated hydrogen, or excited tritium for surface treatment. Alternatively, the hydrogen-based gas of the treatment gas may be excited at a position apart from the treatment chamber 6 by plasma discharge or use of a catalyst, and the excited hydrogen-based gas is then introduced into the treatment chamber 6 to treat the surface of the substrate. This can also produce the same effect.

Examples of the excited hydrogen-based gas used in the method of the invention include hydrogen radicals, hydrogen ions, atomic hydrogen, deuterium radicals, deuterium ions, atomic deuterium, deuterated hydrogen radicals, deuterated hydrogen ions, atomic deuterated hydrogen, tritium radicals, tritium ions, and atomic tritium.

The microwave applicator 1 introduces microwaves to the treatment chamber through the microwave transmitting window 2. The microwave applicator may include a microwave antenna or a microwave waveguide. The microwave transmitting window 2 is made of a dielectric material, such as quartz glass or aluminum nitride.

The substrate P transferred into the treatment chamber 6 is heated to a predetermined temperature on the heater stage 5, and treated with the gas plasma containing deuterium excited by microwaves under a predetermined pressure. The predetermined pressure can be in the range of 50 to 400 Pa.

While the present embodiment uses a sheet-fed type apparatus including the load lock chamber 11 for the treatment, the apparatus is not limited to such a structure. For example, the apparatus may use an open-to-air treatment chamber 6 that can directly communicate with the atmospheric air by opening the gate valve without the load lock chamber 11. The apparatus may be of a batch type in which a plurality of substrates P are treated in the treatment chamber 6 at one time.

In the present embodiment, the object, or the substrate P, is surface-treated by exposing the surface to an atmosphere containing at least one gas selected from the group consisting of the above-mentioned hydrogen, deuterium, deuterated hydrogen, and tritium.

The state of the substrate after the surface treatment will now be described with reference to an experimental example.

EXPERIMENTAL EXAMPLE

A test piece was first prepared as described below. An amorphous silicon oxide layer was formed to a thickness of 100 nm over the surface of a single crystal silicon substrate by thermal oxidation. Subsequently, an amorphous silicon (hereinafter referred to as "a-Si") layer was formed to a thickness of 400 nm on the amorphous silicon oxide layer by CVD. Then, an amorphous silicon oxide layer was formed to a thickness of 50 nm on the a-Si layer by plasma CVD.

The resulting test piece was surface-treated in the apparatus 100 shown in FIG. 1.

The temperature of the heater stage 5 on which the test piece was placed was set at 280° C., and the internal pressure of the treatment chamber 6 was controlled to 66.7 Pa with the exhaust system while deuterium ($D_2$) was being introduced as the treatment gas.

Microwaves of 2.45 GHz were generated from the microwave generator 7 at a power of 3 kW with the above conditions maintained. The microwaves were introduced into the treatment chamber 6 through the microwave applicator 1 and the microwave transmitting window 2 to generate deuterium plasma.

Under the above conditions, the test piece was treated with the deuterium plasma for 10 minutes.

Another test piece was prepared in the same manner except that the surface treatment was performed with hydrogen ($H_2$) instead of deuterium.

Figure 3:
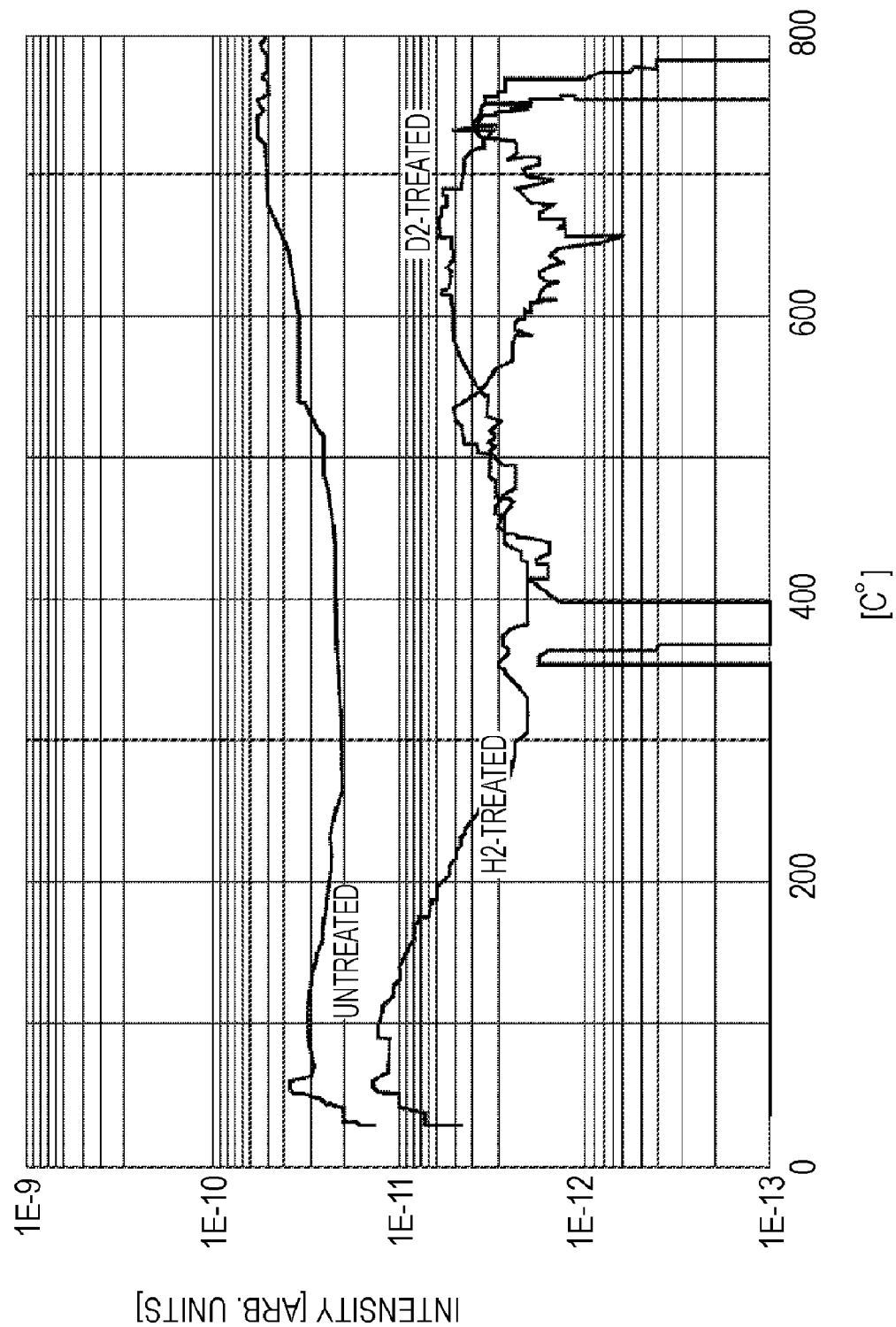
FIG. 3 is a plot showing desorption of water molecules from silicon substrates containing amorphous silicon analyzed by TDS.

FIG. 3 shows the results of analysis performed on the test piece surface-treated with deuterium (test piece A1), the test piece surface-treated with hydrogen (test piece B1), and an untreated test piece (test piece C1).

The desorption of water molecules were compared among the three test pieces by TDS (thermal desorption spectrometry).

In FIG. 3, the result of test piece A1, which was treated with $D_2$ plasma, is designated by "D2-TREATED"; the result of test piece B1, which was treated with hydrogen ($H_2$) plasma, is designated by "H2-TREATED"; and the result of untreated test piece C1 is designated by "UNTREATED".

In the TDS analysis, gases desorbing from a test piece heated at a predetermined heating rate in a vacuum are measured with a mass spectrometer. Thus, the temperature dependence of desorption (relative value) of a gas having a designated molecular weight can be measured.

FIG. 3 shows desorption of water molecules (molecular weight: 18).

General measurement of desorption of water molecules from a silicon-based material provides information about surface-adsorbed water around 100° C., hydrogen-bound water (occluded water) around 300° C., and constitution water (water produced by film decomposition) at 400° C. or more.

According to FIG. 3, the test piece B1 shows that while the water desorption around 300° C. is larger than that of the untreated test piece C1, the peak of the measurement lies around 100° C. This suggests that water was adsorbed again onto the surface after the hydrogen plasma treatment.

On the other hand, test piece A1 exhibited no water desorption between room temperature and 300° C.

This suggests that deuterium plasma can not only remove surface-adsorbed water and hydrogen-bound water efficiently, but can also prevent water from readsorbing onto the surface of the object.

Test piece A1 was allowed to stand in a clean room for 2 months after the deuterium plasma treatment. Then, test piece A1 was subjected to TDS analysis for water desorption. The resulting spectrum showed substantially the same characteristics. Thus, it has been shown that the ability of preventing water adsorption can continue for a significantly long period of time.

In addition, it has been shown that by exposing the surface of the substrate treated with the hydrogen plasma to, for example, ultraviolet light, the hydrophobic surface of the substrate is turned hydrophilic, changing the wettability.

In particular, by exposing the surface of the substrate to an atmosphere containing water, such as atmospheric air, after the exposure to light, the surface is turned hydrophilic more rapidly.

Although the mechanism has not been clarified in detail, it is believed that the bonds between hydrogen and atoms constituting the substrate are broken by exposure to light and the broken sites which include so called "dangling bond" are readily made.

The inventors conducted additional experiments, and found preferred conditions for the surface treatment as described in the following embodiment.

The description will now come back to the embodiment of the present invention provided hereinbefore.

If the temperature of the substrate is less than 180° C. during the surface treatment, it is difficult to remove hydrogen-bound water. In contrast, if the substrate is treated at a temperature of 400° C. or more, deuterium bound to the substrate desorbs, so that the effect of water desorption begins to be lost. Accordingly, it is preferable that water desorption be performed at a temperature in the range of 180 to 400° C. For more efficient water desorption, a temperature in the range of 250 to 400° C. is preferred.

The surface treatment, or water desorption treatment, can be performed under a pressure in the range of 50 to 400 Pa.

A surface treatment performed at a pressure of less than 50 Pa may be affected by the etching reaction of silicon (Si→$SiD_4$). More specifically, high-energy deuterium ions capable of etching in plasma can easily reach the substrate P under such pressure. In contrast, under a pressure of higher than 400 Pa, activated forms of deuterium do not easily reach the substrate P, and accordingly the efficiency of water desorption is significantly reduced.

Preferably, the treatment gas used in the present embodiment can have a high deuterium concentration and low hydrogen atoms (H) and water concentrations. For example, the treatment gas has a deuterium $D_2$ concentration of 95% by volume or more.

Preferably, the total content of $H_2$ and HD is less than 1% by volume and the $H_2O$ content in the treatment gas is less than 0.1% by volume. By adjusting the composition of the treatment gas as above, deuterium can be used more effectively and the interference with water desorption from water contained in the treatment gas can be prevented.

The plasma treatment performed in the present invention can use surface wave plasma produced by microwaves. The surface wave plasma can have high density and produce high-density activated deuterium, consequently efficiently achieving water desorption. The surface wave plasma can be produced from microwave plasma treatment apparatuses disclosed in, for example, Japanese Patent Laid-Open Nos. 11-40397 and 2002-299241 and PCT Publication No. WO 03/056622.

The object to be treated according to the present invention may be made of a metal, a semiconductor, or an insulator, such as polycrystalline silicon with different crystal grain sizes, single crystal silicon, amorphous silicon, metal silicide, strained silicon, silicon oxide, silicon carbide, or aluminium oxide. The surface of the object may be a composite including some of these materials.

First Embodiment

Figure 4A:
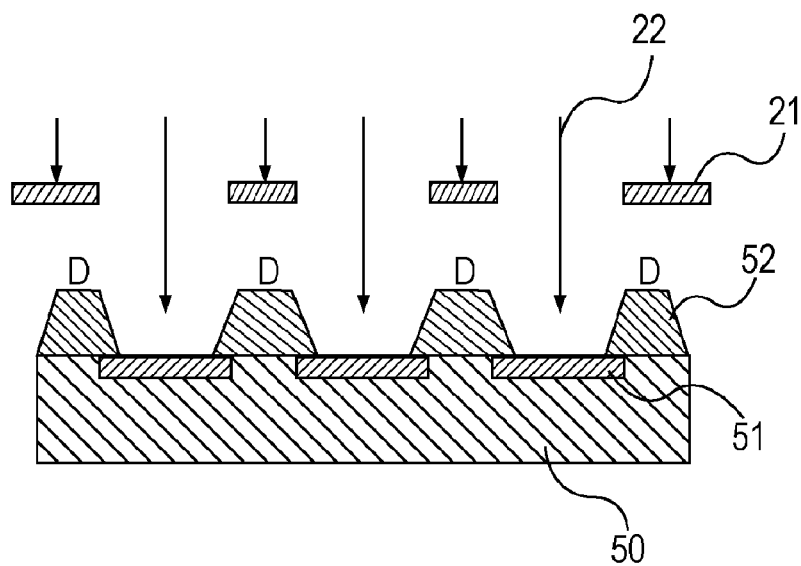
FIGS. 4A to 4C are schematic sectional views illustrating a method for producing an organic EL display device using the patterning method according to an embodiment of the present invention.
Figure 4B:
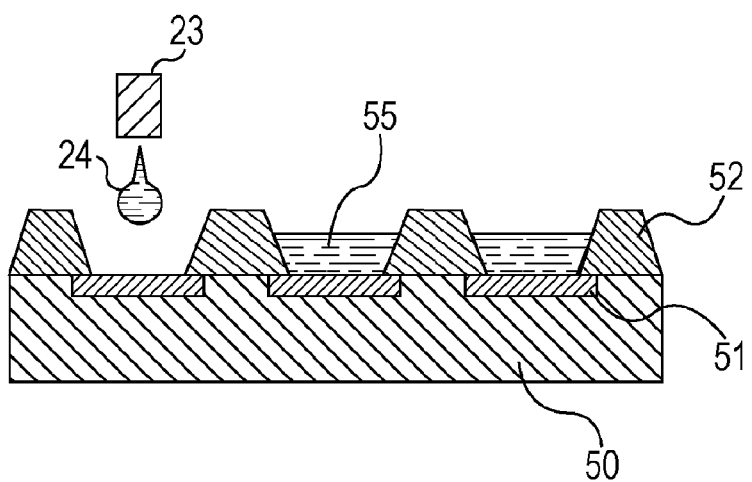
Figure 4C:
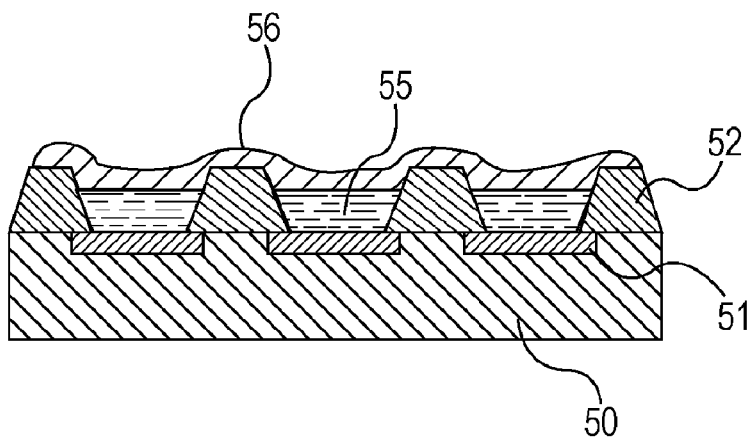

A first embodiment illustrated in FIGS. 4A to 4C describes a method for producing an organic EL display device.

In the production of the organic EL display device, first, lower electrodes 51 made of, for example, aluminum, silver, ITO, or the like are formed on a substrate 50 by, for example, deposition and patterning, as shown in FIG. 4A. The lower electrodes 51 are covered with a layer of polyimide, silicon nitride, silicon oxide, or the like for forming element isolation regions. This layer is patterned so as to straddle each two adjacent lower electrodes 51 and then cleaned, thus forming the element isolation regions 52. Accordingly the element isolation regions 52 are disposed between two adjacent lower electrodes 51.

Then, plasma is generated in an atmosphere containing deuterium gas and hydrogen gas, and the surface of the substrate; that is, each surface of the lower electrodes 51 and element isolation regions 52, is exposed to the plasma for surface treatment in the apparatus as shown in FIG. 1. Thus, the water adsorbed on the surface is removed to form a hydrophobic surface.

The hydrophobic surface of the substrate is exposed to ultraviolet light 22 with a wavelength of 365 nm generated from a mercury lamp through an exposure optical mask 21. The mask 21 allows the light 22 to selectively irradiate only the surfaces of the lower electrodes 51.

Turning now to FIG. 4B, the resulting substrate is placed in atmospheric air, and a liquid 24 is selectively applied onto the lower electrodes 51 by jetting the liquid 24 from a head 23 of an ink jet apparatus, followed by drying.

The liquid used in the present embodiment contains a functional material for forming organic EL active layers of light-emitting elements. For example, the liquid may be a preparation containing polyvinylcarbazole, coumarin 6, an oxadiazole compound, and trichloroethane. Thus, a pattern is formed which includes the organic EL active layers 55 in the pixel regions overlying the respective lower electrodes.

Turning now to FIG. 4C, an upper electrode 56 is formed of, for example, ITO. Thus, an organic EL display device can be produced.

The organic EL display device may be of a passive matrix type or an active matrix type. The passive matrix type may use a glass substrate. The active matrix type may use a glass substrate with an active matrix circuit including polycrystalline silicon TFTs.

The organic EL active layer will now be described. The active layers may be defined by a single color pattern or a full color structure including R, G, and B luminescent layers, each formed on a patterning layer so as to be arranged in a predetermined order.

Each organic EL element including the active layer may have the structure (1) of cathode/patterning layer/hole injection layer (buffer layer)/hole transport layer/luminescent layer/electron transport layer/electron injection layer (buffer layer)/anode, or the structure (2) of cathode/hole injection layer (buffer layer)/hole transport layer/luminescent layer/electron transport layer/electron injection layer (buffer layer)/patterning layer/anode.

The luminescent layer can be formed of a dye. Exemplary dyes include cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring derivatives, pyridine ring derivatives, perylene derivatives, oligothiophene derivatives, triphenylamine derivatives, oxadiazole dimers, and pyrazoline dimers.

The luminescent layer can also be formed of a metal complex. Exemplary metal complexes include aluminum quinolinol complexes, benzoquinolinol beryllium complexes, benzooxazole zinc complexes, benzothiazole zinc complexes, azomethyl zinc complexes, porphyrin zinc complexes, and europium complexes. The central metals of the complexes include Al, Zn, Be, and rare-earth metals, such as Tb, Eu, and Dy. The ligands include oxadiazole, thiadiazole, phenylpyridine, phenylbenzoimidazole, and quinoline.

The luminescent layer can also be formed of a polymer. Exemplary polymers include poly(para-phenylenevinylene) derivatives, polythiophene derivatives, polyparaphenylene derivatives, polysilane derivatives, polyacetylene derivatives, polyvinylcarbazole, and polyfluorenone derivatives.

Exemplary dopants include perylene derivatives, coumarin derivatives, rubrene derivatives, quinacridone derivatives, squarylium derivatives, porphyrin derivatives, styryl dyes, tetracene derivatives, pyrazoline derivatives, decacyclene, and phenoxazone.

The hole injection layer (buffer layer) may be formed of a phenyl amine, a starburst amine, a phthalocyanine, an oxide such as vanadium oxide, molybdenum oxide, ruthenium oxide, or aluminium oxide, amorphous carbon, polyaniline, or a polythiophene derivative.

The electron injection layer (buffer layer) may be formed of aluminum lithium alloy, lithium fluoride, strontium, magnesium oxide, magnesium fluoride, strontium fluoride, calcium fluoride, barium fluoride, aluminium oxide, strontium oxide, calcium, polymethyl methacrylate, sodium polystyrenesulfonate.

Among these materials, polymeric materials are generally applied by ink jetting, pattern printing, or the like. Low-molecular-weight materials may be dispersed in a resin and then applied in the same manner as the polymeric materials.

In the structures (1) and (2) of the active layer, the charge injection layer, the charge transport layer, and the luminescent layer may be defined by a single layer having the functions of those layers or by a layer formed of a mixture containing materials having the functions of those layers, instead of forming three layers having their respective functions.

As described above, the active layers can be formed by ink jetting or pattern printing in which the material of the active layers is applied in a pattern. For ink jetting or printing, regions (pixel regions) where single-color luminescent layers or R, G, and B luminescent layers will be formed are exposed to light in a pattern. Then, each color ink (liquid for forming the corresponding active layers) is applied from an ink jet apparatus or a printing apparatus according to the exposed pattern. The ink is rejected from the unexposed regions according to the exposed pattern, and is thus precisely deposited in the exposed regions according to the pattern. Thus, the resulting organic EL elements can be precisely arranged in a pattern.

Second Embodiment

A second embodiment describes a method for producing surface-conduction electron-emitting elements.

Figure 5A:
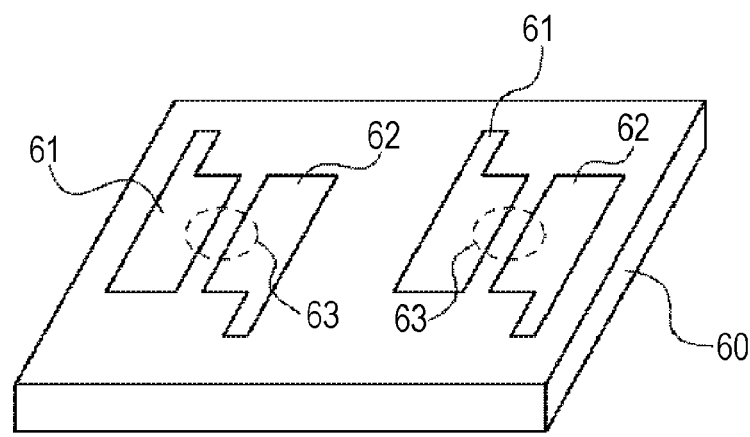
FIGS. 5A to 5C are schematic sectional views illustrating a method for producing a surface-conduction electron-emitting display device using the patterning method according to an embodiment of the present invention.

As shown in FIG. 5A, a pair of electrodes 61 and 62 is formed of platinum or the like by sputtering and etching on, for example, a silicon or glass substrate 60 whose surface has been oxidized.

After cleaning the substrate, plasma is generated in an atmosphere containing deuterium gas and hydrogen gas, and the surface of the substrate; that is, each surface of the substrate 60 and the pair of electrodes 61 and 62, is exposed to the plasma for surface treatment in the apparatus as shown in FIG. 1. Thus, the water adsorbed on the surface is removed to form a hydrophobic surface.

The hydrophobic surface of the substrate is exposed to ultraviolet light with a wavelength of 365 nm generated from a mercury lamp through an exposure mask. The mask allows the light to selectively irradiate part of the electrodes 61 and 62 and gaps between the electrodes. Thus, exposed regions 63 and unexposed regions are defined.

Figure 5B:
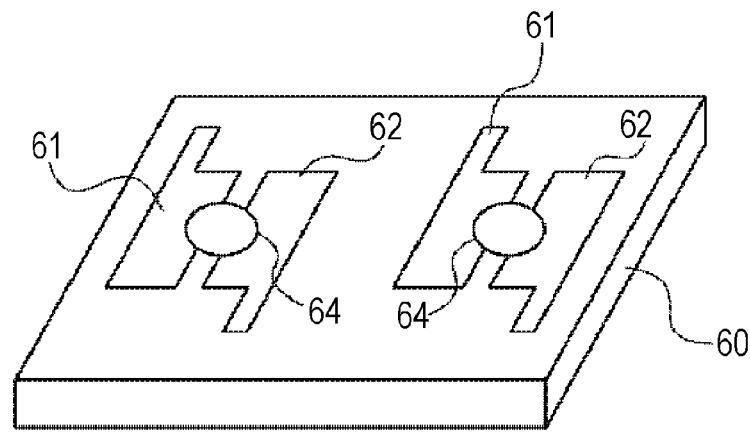
Figure 5C:
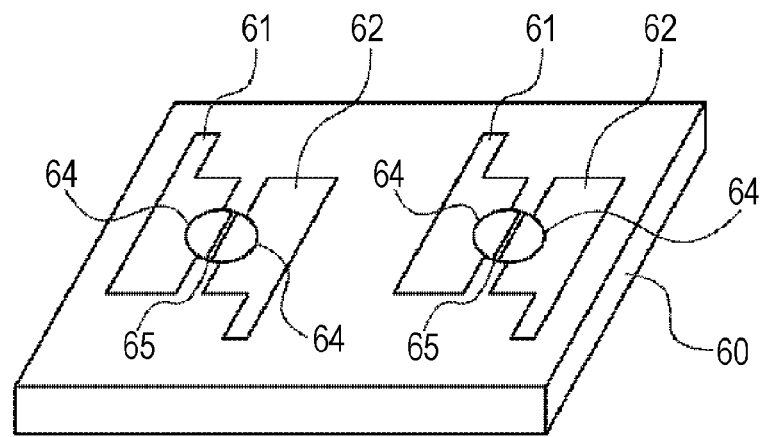

Then, a material (ink) for forming element films is applied onto the exposed regions 63 by ink jetting and then dried. Since the exposed regions 63 are turned hydrophilic by the light exposure and have superior wettability and the unexposed regions are hydrophobic and have inferior wettability due to the hydrogen plasma treatment, the ink is deposited to form the element films 64 only in the exposed regions 63, as shown in FIG. 5B.

The substrate provided with the element films 64 is placed in a reducing atmosphere containing hydrogen, and a current is passed through the element films 64 from the pair of electrodes 61 and 62. Each element film is cracked around the middle to form a gap 65 separating a pair of portions of the element film 64.

Then, a current is optionally passed through the element films 64 in the same manner in an atmosphere containing carbon, so that carbon is deposited on each pair of portions of the element films 64 to narrow the gap 65.

Thus, surface-conduction electron-emitting elements are produced.

Another substrate having fluorescent films and anodes arranged at predetermined intervals is opposed to the substrate provided with the plurality of electron-emitting elements, followed by sealing, and the inside is evacuated. Thus, a surface-conduction electron-emitting display device (SED) is produced.

The element films of the surface-conduction electron-emitting display device may be formed of a material disclosed in Japanese Patent Laid-Open No. 9-106755 or 10-64415.

The present embodiment can form the element films with a desired size in desired regions with high reproducibility. The resulting electron-emitting elements can exhibit uniform electron emission characteristics.

Third Embodiment

A third embodiment describes a method for producing color filters.

Figure 6A:
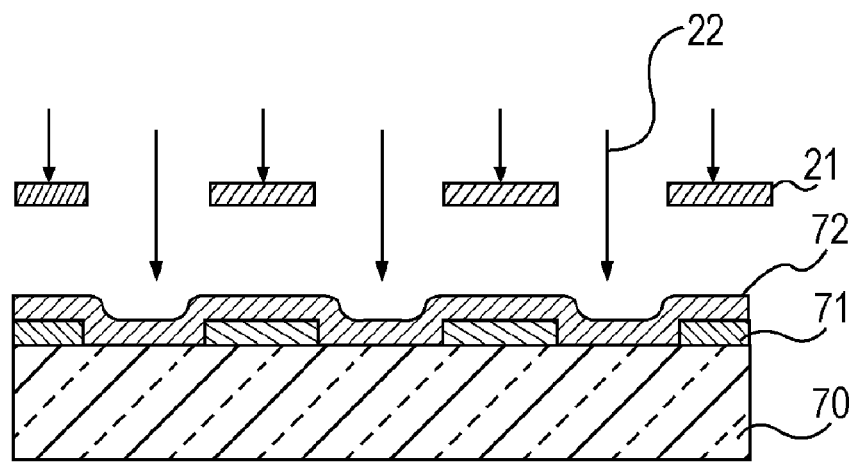
FIGS. 6A and 6B are schematic sectional views illustrating a method for producing color filters using the patterning method according to an embodiment of the present invention.

A light-shielding layer 71 intended for a black matrix, and optionally an ink receiving layer 72 are formed in that order on a transparent substrate 70 made of, for example, glass, as shown in FIG. 6A.

After cleaning the substrate 70, plasma is generated in an atmosphere containing deuterium gas and hydrogen gas, and the surface of the substrate, that is, the surface of the ink receiving layer 72, is exposed to the plasma for surface treatment in the apparatus as shown in FIG. 1. Thus, the water adsorbed on the surface is removed to form a hydrophobic surface.

The hydrophobic surface of the substrate is exposed to ultraviolet light 22 with a wavelength of 365 nm generated from a mercury lamp through an exposure mask 21, as shown in FIG. 6A. The mask 21 allows the light 22 to selectively irradiate mainly the regions not having the light-shielding layer 71.

Figure 6B:
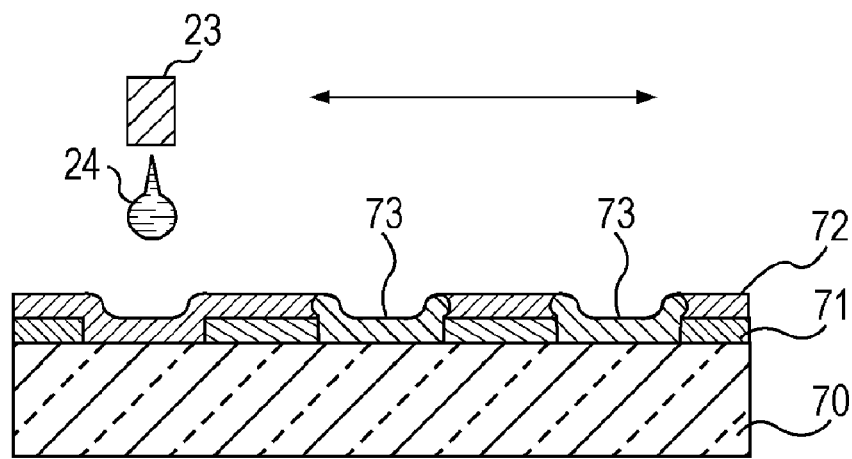

Then, a material (ink) 24 for forming color layers is jetted onto the regions exposed to the light of the ink receiving layer 72 from an ink jet head 23 scanning in the direction indicated by the double-headed arrow, and then dried. Since the exposed regions are turned hydrophilic by the light exposure and has superior wettability and the unexposed regions are hydrophobic and have inferior wettability due to the hydrogen plasma treatment, the ink is deposited to form color layers 73 only in desired regions, as shown in FIG. 6B.

By forming different color layers using R, G, and B inks in the above manner, color filters can be produced.

The present embodiment can apply inks to respective predetermined regions, thus preventing color mixture. Accordingly, precisely arranged color filters can be produced at low cost.

Fourth Embodiment

A fourth embodiment describes a method for producing illuminants.

Figure 7A:
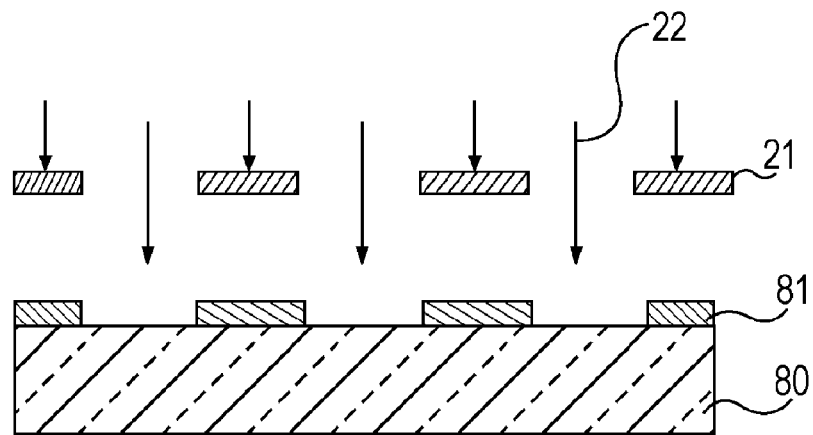
FIGS. 7A and 7B are schematic sectional views illustrating a method for producing illuminants using the patterning method according to an embodiment of the present invention.

A light-shielding layer 81 intended for a black matrix is formed on a transparent substrate 80 made of, for example, glass, as shown in FIG. 7A.

After cleaning the substrate, plasma is generated in an atmosphere containing deuterium gas and hydrogen gas, and the surface of the substrate is exposed to the plasma for surface treatment in the apparatus as shown in FIG. 1. Thus, the water adsorbed on the surface is removed to form a hydrophobic surface.

The hydrophobic surface of the substrate is exposed to ultraviolet light 22 with a wavelength of 365 nm generated from a mercury lamp through an exposure mask 21. The mask 21 allows the light 22 to selectively irradiate mainly the regions not having the light-shielding layer 81.

Figure 7B:
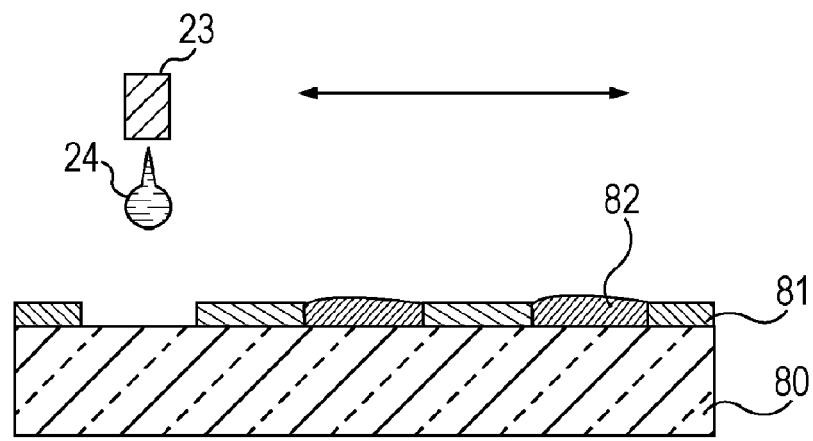

Then, a material (ink) 24 for forming fluorescent phosphor layers, or illuminant material layers, is jetted on the regions exposed to the light from an ink jet head 23 scanning in the direction indicated by the double-headed arrow, and then dried. Since the exposed regions are turned hydrophilic by the light exposure and has superior wettability and the unexposed regions are hydrophobic and have inferior wettability due to the hydrogen plasma treatment, the ink is deposited to form fluorescent phosphor layers 82 only in desired regions, as shown in FIG. 7B.

By forming different color fluorescent phosphor layers using R, G, and B fluorescent phosphor inks, illuminants (fluorescent illuminants) can be produced for color CRTs, color FEDs, or color SEDs.

The present embodiment can apply fluorescent phosphor inks to respective predetermined regions, thus preventing color mixture. Accordingly, precisely arranged illuminants can be produced at low cost.

Fifth Embodiment

Figure 8A:
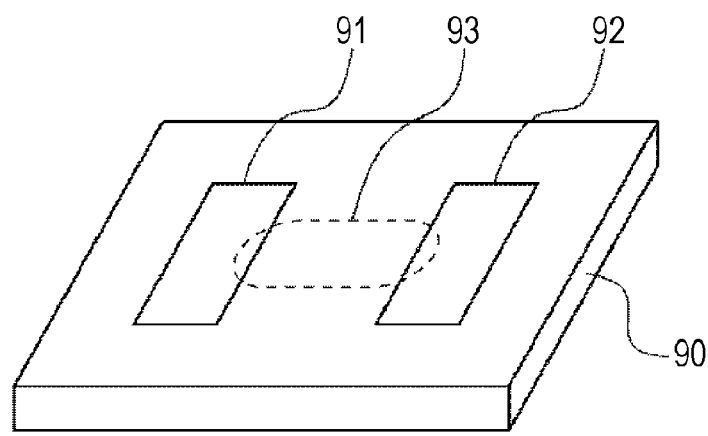
FIGS. 8A, 8B, and 8C are schematic sectional views illustrating a method for producing a thin-film transistor using the patterning method according to an embodiment of the present invention.
Figure 8B:
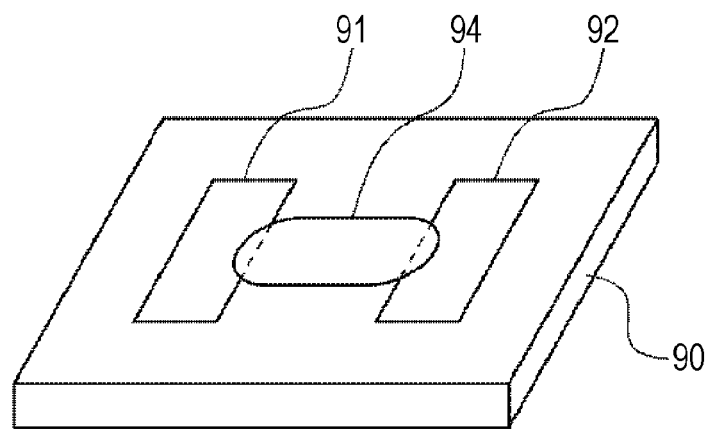
Figure 8C:
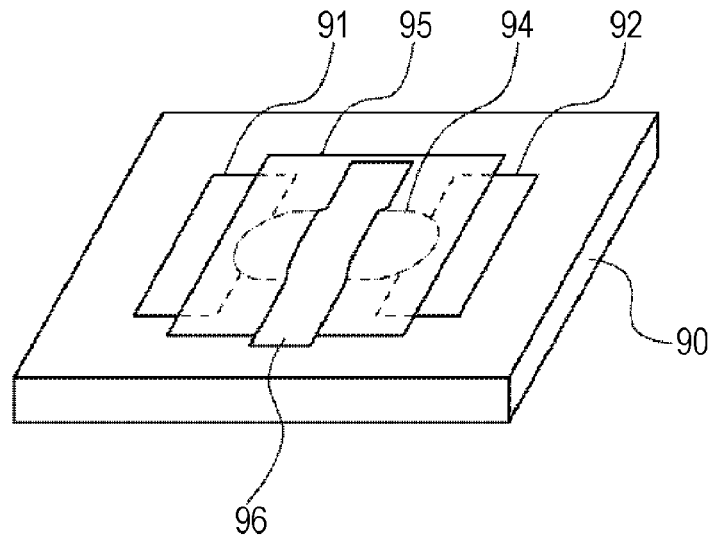

A fifth embodiment as shown in FIGS. 8A to 8C describes a method for producing thin-film transistors.

A pair of electrodes 91 and 92 are formed of platinum, aluminum, gold, or the like by sputtering and etching, or by lift-off on, for example, a silicon or glass substrate 90 whose surface has been oxidized. The pair of electrodes serves as a source and a drain electrode of a thin-film transistor.

After cleaning the substrate, plasma is generated in an atmosphere containing deuterium gas and hydrogen gas, and the surface of the substrate; that is, each surface of the substrate 90 and the pair of electrodes 91 and 92, is exposed to the plasma for surface treatment in the apparatus as shown in FIG. 1. Thus, the water adsorbed on the surface is removed to form a hydrophobic surface.

The hydrophobic surface of the substrate is exposed to ultraviolet light with a wavelength of 365 nm generated from a mercury lamp through an exposure mask. The mask allows the light to selectively irradiate part of the electrodes 91 and 92 and gap between the electrodes. Thus, an exposed region 93 is formed as shown in FIG. 8A.

Then, a material (ink) for forming an active layer of the thin-film transistor is applied onto the exposed region 93 by ink jetting and then dried. Since the exposed region 93 is turned hydrophilic by the light exposure and has superior wettability and the unexposed region is hydrophobic and has inferior wettability due to the hydrogen plasma treatment, the ink is deposited to form the active layer 94 of the thin-film transistor only in a desired region, as shown in FIG. 8B.

Turning to FIG. 8C, the active layer 94 is covered with a gate insulating film 95, and a gate electrode 96 is formed on the gate insulating film 95.

Thus, an organic thin-film transistor can be produced.

The present embodiment can apply an ink for forming the active layer acting as a channel of the thin-film transistor to a desired region. Consequently, the deviation in channel width can be reduced, and thus thin-film transistors exhibiting uniform characteristics can be produced with high reproducibility at low cost. The resulting thin-film transistors are highly precise and exhibit high performance.

In the embodiments, the surface treatment may be performed by exposing the substrate to excited hydrogen gas, instead of plasma of broadly defined hydrogen gas. Excited hydrogen gas can also produce the same effect.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-370096 filed Dec. 22, 2005, which is hereby incorporated by reference herein in its entirety.

What is claimed is:

1. A patterning method comprising:
   (a) treating the surface of an object by exposing the surface to an atmosphere comprising deuterium plasma;
   (b) partially exposing the treated surface to light to form an exposed region and an unexposed region; and
   (c) applying a liquid onto one of the exposed region and the unexposed region.

2. The patterning method according to claim 1, including conducting step (a) by generating a plasma in the atmosphere.

3. The patterning method according to claim 1, including conducting step (c) by jetting the liquid.

4. The patterning method according to claim 1, including conducting step (a) by generating a plasma in an atmosphere containing deuterium.

5. The patterning method according to claim 4, including providing a deuterium concentration of 95% by volume or more.

6. A method for producing an electro-optic device that includes a plurality of elements on a substrate, each said element emitting light or electrons according to electrical energy supplied, comprising:
   (a) treating the surface of the substrate by exposing the surface to an atmosphere comprising deuterium plasma;

(b) partially exposing the treated surface to light to form exposed regions and unexposed regions;

(c) applying a liquid onto the exposed regions or the unexposed regions; and (d) forming the elements using the liquid.

7. The method according to claim 6, including conducting step (d) to prepare electron-emitting elements by forming pairs of electrodes; drying the liquid to form electroconductive layers; and forming a gap in each electroconductive layer by passing a current through the electroconductive layer.

8. The method according to claim 6, including conducting step (d) to prepare organic light-emitting elements by forming a first electrode; drying the liquid to form an organic material layer; and forming a second electrode on the organic material layer.

9. A method for producing a color filter, comprising:
(a) treating the surface of a substrate by exposing the surface to an atmosphere comprising deuterium plasma;
(b) partially exposing the treated surface to light to form an exposed region and an unexposed region; and
(c) applying a liquid onto one of the exposed region and the unexposed region to form a color layer.

10. A method for producing an illuminant, comprising:
(a) treating the surface of a substrate by exposing an atmosphere comprising deuterium plasma;
(b) partially exposing the treated surface to light to form an exposed region and an unexposed region; and
(c) applying a liquid onto one of the exposed region and the unexposed region to form an illuminant material layer.

11. method for producing a thin film transistor, comprising:
(a) treating the surface of a substrate by exposing the surface to an atmosphere comprising deuterium plasma;
(b) partially exposing the treated surface to light to form an exposed region and an unexposed region; and
(c) applying a liquid onto one of the exposed region and the unexposed region to form an active material layer.

* * * * *